(12) United States Patent
Inoue

(10) Patent No.: US 9,252,124 B2
(45) Date of Patent: Feb. 2, 2016

(54) CIRCUIT MODULE HAVING A SUBSTRATE, SEMICONDUCTOR CHIP, AND MOLDING MATERIAL FORMED BY DICING

(71) Applicant: SEIKO EPSON CORPORATION, Tokyo (JP)

(72) Inventor: Masashi Inoue, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/515,851

(22) Filed: Oct. 16, 2014

(65) Prior Publication Data

US 2015/0108665 A1 Apr. 23, 2015

(30) Foreign Application Priority Data

Oct. 22, 2013 (JP) .................................. 2013-219025

(51) Int. Cl.
| | |
|---|---|
| H01L 23/48 | (2006.01) |
| H01L 23/52 | (2006.01) |
| H01L 29/40 | (2006.01) |
| H01L 23/29 | (2006.01) |
| H01L 23/34 | (2006.01) |
| H01L 23/02 | (2006.01) |
| H01L 23/00 | (2006.01) |
| H01L 21/78 | (2006.01) |
| H01L 21/56 | (2006.01) |

(52) U.S. Cl.
CPC .............. *H01L 24/94* (2013.01); *H01L 21/565* (2013.01); *H01L 21/78* (2013.01); *H01L 24/48* (2013.01); *H01L 24/85* (2013.01); *H01L 24/45* (2013.01); *H01L 2224/45144* (2013.01); *H01L 2224/48227* (2013.01); *H01L 2224/85* (2013.01); *H01L 2924/00014* (2013.01)

(58) Field of Classification Search
CPC .................. H01L 2924/01079; H01L 2924/14; H01L 2924/01013; H01L 2924/01078; H01L 2924/15311; H01L 2224/48091; H01L 23/3135; H01L 23/293; H01L 23/295
USPC ......... 257/784, 786, 787, 790, 792, 793, 685, 257/723
See application file for complete search history.

(56) References Cited

U.S. PATENT DOCUMENTS

| | | | |
|---|---|---|---|
| 6,841,881 B2 * | 1/2005 | Katagiri et al. ................ | 257/777 |
| 7,042,073 B2 | 5/2006 | Kado et al. | |
| 7,479,627 B2 | 1/2009 | Yoshimoto et al. | |

FOREIGN PATENT DOCUMENTS

| | | |
|---|---|---|
| JP | A-2002-92567 | 3/2002 |
| JP | A-2006-60153 | 3/2006 |
| JP | A-2007-214360 | 8/2007 |
| JP | A-2011-18935 | 1/2011 |
| JP | A-2011-66193 | 3/2011 |
| JP | A-2013-105992 | 5/2013 |

* cited by examiner

*Primary Examiner* — A. Sefer
*Assistant Examiner* — Dilinh Nguyen
(74) *Attorney, Agent, or Firm* — Oliff PLC

(57) ABSTRACT

A circuit module including: a wiring substrate having a shape elongated in one direction; a semiconductor chip mounted on the wiring substrate; and a molding material that molds the semiconductor chip, wherein end faces of the molding material that extend along a lengthwise direction of the wiring substrate and intersect with a lateral direction of the wiring substrate are formed by dicing performed along end faces of a partial region of the wiring substrate.

8 Claims, 5 Drawing Sheets

CIRCUIT MODULE HAVING A SUBSTRATE, SEMICONDUCTOR CHIP, AND MOLDING MATERIAL FORMED BY DICING

BACKGROUND

1. Technical Field

The present invention relates to a circuit module including at least one semiconductor chip that is mounted on a wiring substrate and molded with a molding material, and a method for manufacturing such a circuit module.

2. Related Art

With a miniaturized circuit module, a semiconductor chip (bare chip) that is not encapsulated in a package is mounted on a wiring substrate by wire bonding or flip chip bonding, and then the semiconductor chip on the wiring substrate is molded with a molding material in order to protect the semiconductor chip and the like.

For example, a plurality of semiconductor chips are mounted on a mother board in which a plurality of wiring substrates are continuously arranged, the semiconductor chips are molded with a molding material, and thereafter the mother board is cut by punching with a die (die cutting). The plurality of wiring substrates are thereby separated. At this time, if the wiring substrates have a small width, the molding material spreads over the widthwise sides of the wiring substrates, and thus the molding material is undesirably cut by the die during punching.

However, the molding material is brittle, and thus if cracking occurs in the cut surfaces of the molding material, a molding defect occurs, resulting in a low manufacturing yield of the circuit modules. There is another problem in that if, for example, a residue of the molding material adheres to the end faces of the wiring substrates, an additional step of removing the residue of the molding material is necessary.

In particular, according to a transfer molding method, a plurality of semiconductor chips mounted on a plurality of wiring substrates are collectively and continuously molded with a molding material, and thus when the molding material and the mother board are cut by punching using a die, cracking is likely to occur in the molding material. Also, even when the molding material and the mother board are cut by using a scribing method, cracking is likely to occur in the molding material. For these reasons, it has been difficult to remove the molding material along the end faces of the wiring substrates.

As a related technique, JP-A-2013-105992 (paragraphs 0006, 0048 and 0065, and FIG. 12) discloses a method for manufacturing a substrate module with a built-in semiconductor device, with which it is possible to achieve high integration and miniaturization of semiconductor devices having a specific function, as well as achieving simplification and improved efficiency of the manufacturing steps relating to mounting components. According to this manufacturing method, a plurality of substrate modules with a built-in semiconductor device are obtained by cutting a core substrate, in which a plurality of core substrate regions (substrate module forming regions) applied to a substrate device portion are continuously provided, along dicing streets into substrate module forming regions so as to singulate the substrate modules.

According to JP-A-2013-105992, a plurality of substrate modules can be obtained by cutting the core substrate, in which a plurality of substrate module forming regions are provided, along the dicing streets. However, JP-A-2013-105992 contains no disclosure of cutting a core substrate on which a plurality of semiconductor devices molded with a molding material are mounted. Also, if the core substrate is cut from one end to the other by dicing, a large amount of residue of the core substrate or insulating layer is generated, and the problem of contamination occurs.

SUMMARY

Accordingly, in view of the points described above, an advantage of some aspects of the invention is to provide a circuit module including a semiconductor chip that is mounted on a wiring substrate and molded with a molding material, wherein cracking that occurs in the molding material is reduced.

In order to solve the problems described above, a circuit module according to one aspect of the invention includes: a wiring substrate having a shape elongated in one direction; a semiconductor chip mounted on the wiring substrate; and a molding material that molds the semiconductor chip, wherein end faces of the molding material that extend along a lengthwise direction of the wiring substrate and intersect with a lateral direction of the wiring substrate are formed by dicing performed along end faces of a partial region of the wiring substrate.

According to the circuit module according to one aspect of the invention, the end faces of the molding material that extend along the lengthwise direction of the wiring substrate and intersect with the lateral direction of the wiring substrate are formed by dicing performed along the end faces of a partial region of the wiring substrate, and it is therefore possible to remove the molding material along the end faces of the wiring substrates without causing a crack in the molding material. Also, when the molding material is cut by dicing, a region of the wiring substrate other than the partial region is not cut, and it is therefore possible to reduce contamination caused by a residue of the substrate material.

For example, the end faces of the molding material that extend along the lengthwise direction of the wiring substrate and intersect with the lateral direction of the wiring substrate may be formed together with the end faces of the partial region of the wiring substrate by dicing after the molding material has been cured. In this case, the cut surfaces that extend in the lengthwise direction of the wiring substrate and intersects with the lateral direction of the wiring substrate are formed at positions flush with the cut surfaces of the partial region of the wiring substrate, the shape of the molding material is accurately formed, and the cut surfaces of the molding material become dense.

Here, if the end faces of another region of the wiring substrate are formed by, for example, punching the mother board with a die, the end faces of the partial region of the wiring substrate and the end faces of the other region of the wiring substrate are formed by different methods. In this case, an appropriate cutting method can be used depending on the region of the wiring substrate.

Also, it is desirable that the end faces of the partial region of the wiring substrate protrude in a widthwise direction of the wiring substrate with respect to the end faces of the other region in the lengthwise direction of the wiring substrate. It is thereby possible to cut the molding material without affecting the other region in the lengthwise direction of the wiring substrate.

Furthermore, it is desirable that the molding material is not cut in a direction substantially perpendicular to the lengthwise direction of the wiring substrate. In this case, the cut direction of the molding material is limited to one direction, and thus the circuit module manufacturing process can be simplified.

Also, it is desirable that the wiring substrate has a width that is smaller than a length of the molding material in the lengthwise direction of the wiring substrate. In this case, it is possible to achieve a circuit module having a size that is small in the widthwise direction of the wiring substrate.

In the above configuration, the semiconductor chip may include a semiconductor chip that is not encapsulated in a package, and be mounted on the wiring substrate by wire bonding. By using such a semiconductor chip that is not encapsulated in a package, it is possible to miniaturize the wiring substrate.

A method for manufacturing a circuit module according to one aspect of the invention includes: (a) preparing a mother board including a plurality of wiring substrates that each have a shape elongated in a first direction and are continuous via a connecting portion in a second direction that is perpendicular to the first direction, and a frame that supports at least connecting portions located at both outermost ends in the second direction of the plurality of wiring substrates; (b) mounting a semiconductor chip on each of the plurality of wiring substrates; (c) molding the plurality of semiconductor chips mounted on the plurality of wiring substrates by a molding material that is continuous in the second direction, and heating and curing the molding material; and (d) after the molding material has been cured, cutting the connecting portion of the plurality of wiring substrates together with the molding material formed on the connecting portion by dicing.

With the method for manufacturing a circuit module according to one aspect of the invention, the connecting portions of the wiring substrates are cut together with the molding material formed on the connecting portions by dicing, it is thereby possible to remove the molding material along the end faces of the wiring substrates without causing a crack in the molding material.

Here, the step (d) may include cutting the connecting portion of the plurality of wiring substrates together with the molding material formed on the connecting portion by dicing, without cutting the mother board in a region other than the connecting portion of the plurality of wiring substrates. In this case, the mother board in a region other than the connecting portions is not cut by dicing, and it is therefore possible to reduce contamination caused by a residue of the substrate material.

Also, if the frame of the mother board supports, in addition to the connecting portions located at both outermost ends in the second direction of the plurality of wiring substrates, opposing end portions in the first direction of each of the wiring substrates, the method for manufacturing a circuit module may further include (e) cutting the opposing end portions in the first direction of each of the wiring substrates so as to separate each of the wiring substrates from the frame of the mother board, which is performed after the step (d). In this case, each of the wiring substrates can be separated after completion of processing such as the inspection of electrical characteristics performed on the plurality of wiring substrates supported by the frame of the mother board.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figures 1A, 1B:
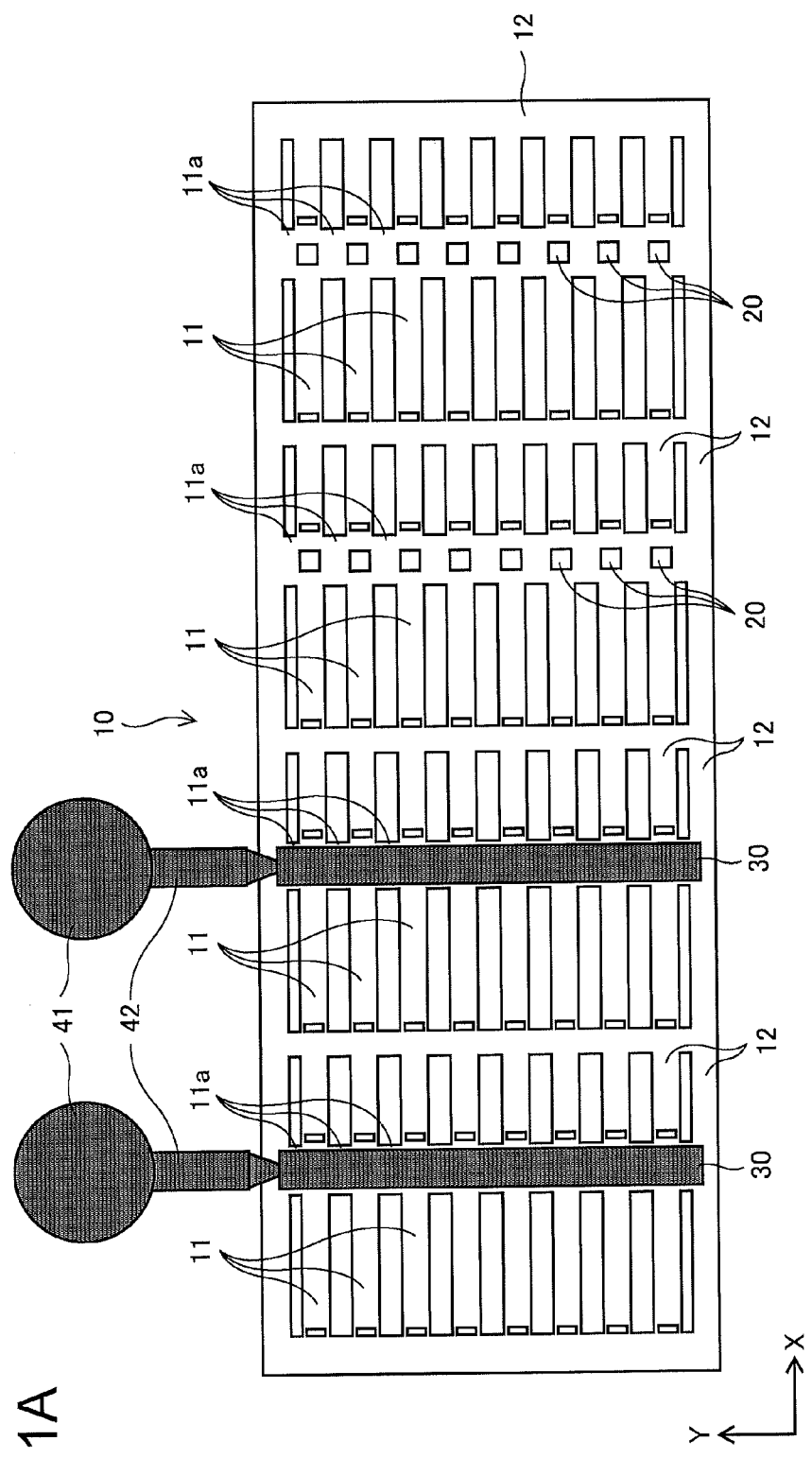
FIGS. 1A and 1B schematically show a work piece in a molding step.

Hereinafter, embodiments of the invention will be described in detail with reference to the drawings. Note that the same constituent elements are given the same reference numerals, and redundant descriptions are omitted.

FIG. 1 schematically shows a work piece in a molding step for manufacturing a circuit module according to an embodiment of the invention. FIG. 1A is a plan view of the work piece, and FIG. 1B is a side view of the work piece. The work piece includes a mother board 10, a plurality of semiconductor chips 20 arranged in at least one column, and a molding material 30 that molds the semiconductor chips 20.

The mother board 10 includes a plurality of wiring substrates 11 arranged in at least one column, and a frame 12 that supports the wiring substrates 11. The mother board 10 is made by, for example, punching out a glass epoxy substrate with a die. In order to manufacture a plurality of circuit modules at a time, such a mother board 10 including a plurality of wiring substrates 11 is used. FIG. 1A shows, as an example, the mother board 10 on which a large number of wiring substrates 11 are arranged in a plurality of rows and a plurality of columns. As used herein, the term "row" refers to an array of a plurality of wiring substrates 11 in an X axis direction in the diagrams, and the term "column" refers to an array of a plurality of wiring substrates 11 in a Y axis direction in the diagrams.

As shown in FIG. 1A, each of the wiring substrates 11 has a shape elongated in a first direction (the X axis direction in the diagram). Also, a plurality of wiring substrates 11 arranged in each column are continuous via connecting portions 11a in a second direction (the width direction of the wiring substrates 11, the Y axis direction in the diagram) perpendicular to the first direction, which is the lengthwise direction of the wiring substrates 11.

The frame 12 of the mother board 10 supports at least the connecting portions 11a located at both outermost ends in the Y axis direction of the plurality of wiring substrates 11 arranged in each column. Furthermore, as shown in FIG. 1A, the frame 12 of the mother board 10 may support opposing end portions in the X axis direction of each of the wiring substrates 11.

At least one semiconductor chip 20 is mounted on each of the wiring substrates 11. The semiconductor chip 20 may be a semiconductor chip (bare chip) that is not encapsulated in a package. The use of bare chips enables miniaturization of the wiring substrates 11. The bare chips are mounted on the wiring substrates 11 by wire bonding or flip chip bonding.

Because the wiring substrates 11 have a small width, it is difficult to independently mold the individual semiconductor chips 20. For this reason, the molding material 30 is continuous in the Y axis direction so as to mold the plurality of semiconductor chips 20 mounted on the plurality of wiring substrates 11 arranged in one column in the Y axis direction. The molding material 30 is formed by a transfer molding method, a screen printing method, or the like. As the molding material 30, for example, a thermosetting resin is used, and in particular, thermosetting epoxy resin is suitable.

FIG. 1A shows a pot 41 and a runner 42 that are used in a transfer molding method. The pot 41 is a container that contains resin tablets made by compacting thermosetting resin powders. Thermosetting resin temporarily melts upon heating. With continued heating, the chemical reaction proceeds, and the thermosetting resin cures. The runner 42 is a small path through which the melted thermosetting resin flows.

In the transfer molding method, a die is fixed above the mother board 10 on which a plurality of semiconductor chips 20 are mounted, a thermosetting resin heated and temporarily melted in the pot 41 is injected into the die through the runner 42, and the thermosetting resin cures in the heated die. After the die has been cooled, the die is removed from the wiring substrates 11.

With the mold encapsulation performed in this way, the semiconductor chips 20 and gold (Au) wires for use in wire bonding can be protected from external stress, moisture and contaminants. However, if the wiring substrates 11 have a small width, the molding material 30 spreads over the widthwise sides of the wiring substrates 11. Accordingly, it is necessary to remove the spread molding material 30 so as to bring the width of the circuit module within a predetermined range.

Figure 2A:
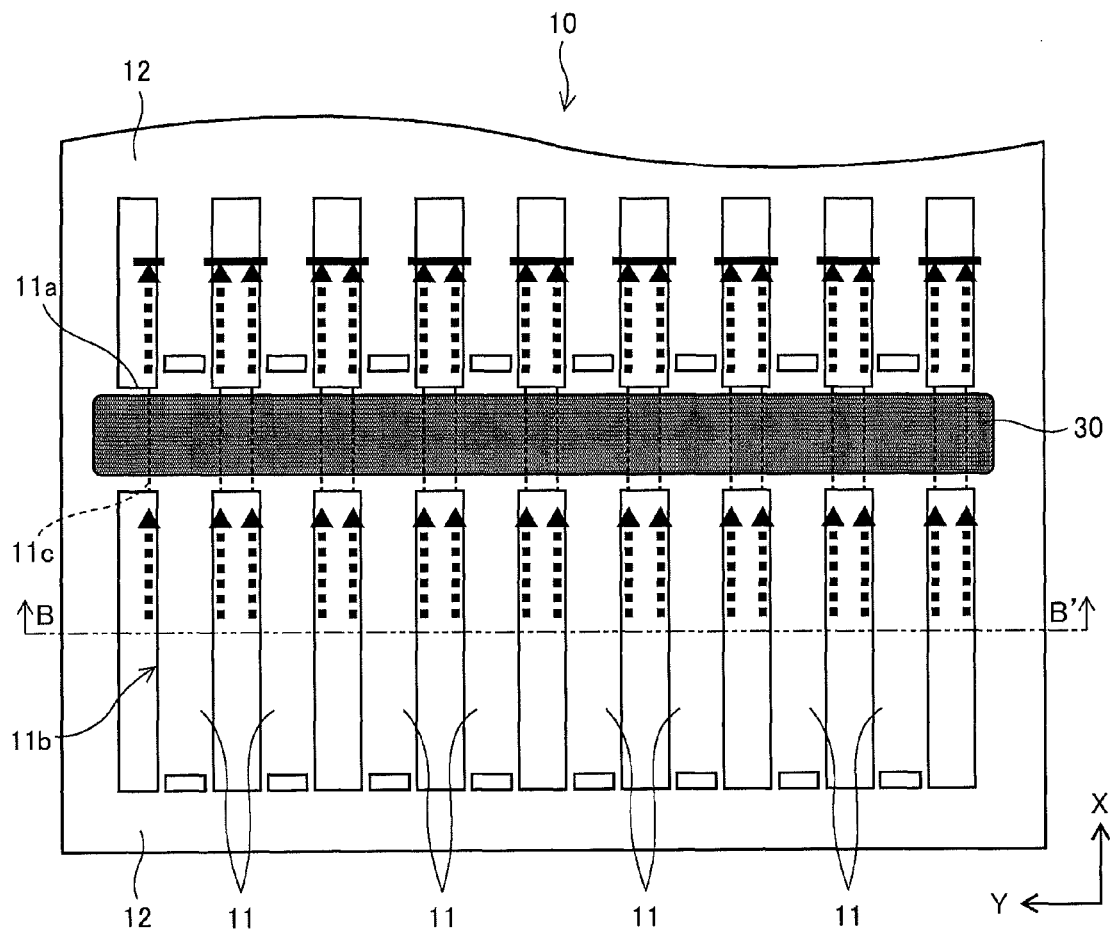
FIGS. 2A and 2B schematically show the work piece in a dicing step.
Figure 2B:
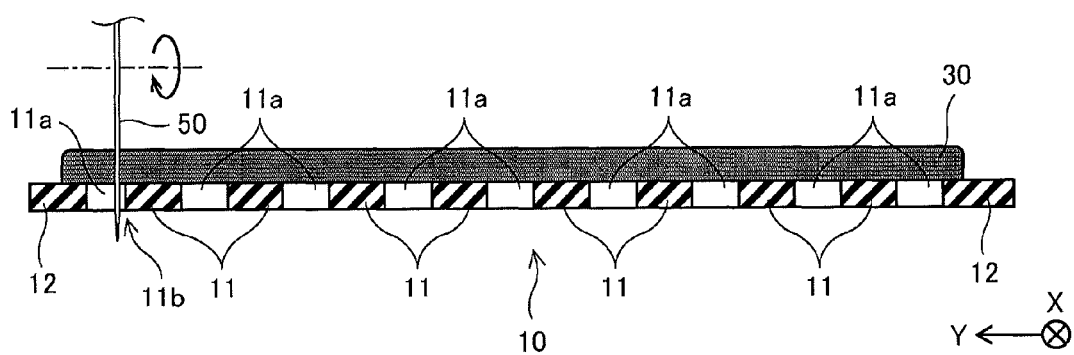

FIG. 2 schematically shows the work piece in a dicing step for manufacturing a circuit module according to an embodiment of the invention. FIG. 2A is a plan view of the work piece, and FIG. 2B is a side cross sectional view of the work piece taken along the line B-B' shown in FIG. 2A. In FIG. 2A, dotted arrows indicate the paths of movement of a dicing blade 50.

As shown in FIG. 2A, the dicing blade 50 is moved down to a height lower than the bottom surface of the mother board 10 at a position at which the frame 12 of the mother board 10 is not present, then moved in a direction substantially parallel to the X axis direction so as to cut the connecting portions 11a and the molding material 30 of the wiring substrates 11, and thereafter moved up before the dicing blade 50 reaches the frame 12 of the mother board 10. Accordingly, in a region other than the connecting portions 11a of the wiring substrates 11, the mother board 10 is not cut.

As shown in FIG. 2B, the dicing blade 50 passes outside end faces 11b of the wiring substrates 11 in the X axis direction (see the left side in the diagram), and cuts the connecting portions 11a of the wiring substrates 11 together with the molding material 30 formed on the connecting portions 11a. As a result, as shown in FIG. 2A, end faces of the molding material 30 extending in a direction substantially parallel to the X axis direction are formed by dicing performed along the end faces 11c of partial regions of the wiring substrates 11 (raised regions remaining after the connecting portions 11a have been cut).

On the other hand, if the molding material 30 is punched with a die after the molding material 30 has been cured, because the molding material 30 is brittle, the cut surfaces of the molding material 30 become rough, and cracking may occur in the cut surfaces of the molding material 30. Also, if the entire mother board 10 is cut by the dicing blade 50, a large amount of residue of the substrate material is generated, and the problem of contamination occurs.

According to the present embodiment, the end faces of the molding material 30 in a direction substantially parallel to the X axis direction are formed by dicing performed along the end faces 11c of a partial region of a wiring substrate 11, and it is therefore possible to remove the molding material 30 along the end faces of the wiring substrates 11 without causing a crack in the molding material 30. Also, when the molding material 30 is cut by dicing, a region of a wiring substrate 11 other than the partial region is not cut, and it is therefore possible to reduce contamination caused by a residue of the substrate material.

However, if dicing is performed before the molding material 30 is cured, the shape of the molding material 30 is deformed. Accordingly, it is desirable that the end faces of the molding material 30 in a direction substantially parallel to the X axis direction are formed together with the end faces 11c of the partial regions of the wiring substrates 11 by dicing after the molding material 30 has been cured.

In this case, the cut surfaces of the molding material 30 in a direction substantially parallel to the X axis direction are formed at positions flush with the cut surfaces of the partial regions of the wiring substrates 11, the shape of the molding material 30 is accurately formed, and the cut surfaces of the molding material 30 become dense. Accordingly, whether or not the end faces of the molding material 30 were formed by dicing after curing of the molding material 30 can be determined by observing the shape of the molding material 30 or measuring the surface roughness of the cut surfaces of the molding material 30.

Here, if the end faces of another region of a wiring substrate 11 are formed by, for example, punching the mother board 10 with the use of a die, the end faces 11c of a partial region of the wiring substrate 11 and the end faces 11b of the other region of the wiring substrate 11 are formed by different methods. As used herein, the term "different methods" means methods that use different means and different conditions for cutting the substrate. In this case, an appropriate cutting method can be used depending on the region of the wiring substrate 11.

Also, it is desirable that the end faces 11c of a partial region of a wiring substrate 11 protrude in the widthwise direction of the wiring substrate 11 with respect to the end faces 11b of another region in the lengthwise direction of the wiring substrate 11. It is thereby possible to cut the molding material 30 without affecting the other region in the lengthwise direction of the wiring substrate 11.

In this way, the connecting portions 11a of all of the wiring substrates 11 are cut together with the molding material 30. Also, in the case in which electronic components other than the semiconductor chips 20 (FIG. 1) are mounted on the wiring substrates 11, the electronic components are mounted on a first or second primary surface of the plurality of wiring substrates 11 supported by the mother board 10. Furthermore, the electrical characteristics of the circuits formed on the plurality of wiring substrates 11 are inspected. After that, opposing end portions of each of the wiring substrates 11 in the X axis direction are cut, the plurality of wiring substrates 11 are thereby separated from the frame 12 of the mother board 10, and individual circuit modules are obtained.

Figure 3:
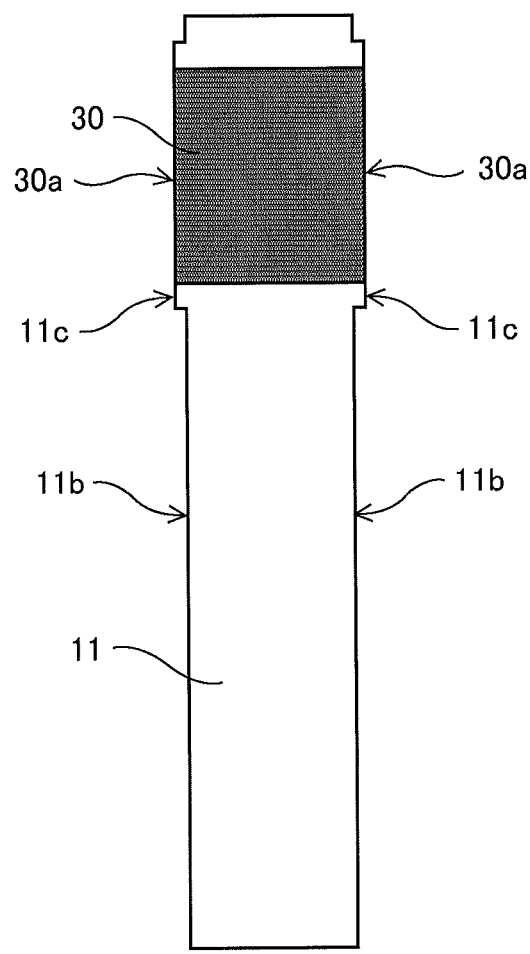
FIG. 3 is a plan view showing an example of an outer configuration of a circuit module according to an embodiment of the invention.

FIG. 3 is a plan view showing an example of an outer configuration of a circuit module according to an embodiment of the invention. This circuit module includes a wiring substrate 11 having a shape elongated in one direction, at least one semiconductor chip 20 (FIG. 1) mounted on the wiring substrate 11, and a molding material 30 molding the at least one semiconductor chip 20. A feature of the circuit module is that end faces 30a of the molding material 30 in a direction substantially parallel to the lengthwise direction of the wiring substrate 11 are formed by dicing performed along the end faces 11c of a partial region of the wiring substrate 11. The end faces 30a of the molding material 30 extend along the lengthwise direction of the wiring substrate 11 and intersect with the lateral direction of the wiring substrate 11.

Here, it is desirable that the molding material 30 is not cut in a direction substantially perpendicular to the lengthwise direction of the wiring substrate 11. In this case, the cut direction of the molding material 30 is limited to one direction, and thus the circuit module manufacturing process can be simplified. Also, it is desirable that the wiring substrate 11 has a width smaller than the length of the molding material 30 in the lengthwise direction of the wiring substrate 11. In this case, it is possible to achieve a circuit module having a size that is small in the widthwise direction of the wiring substrate 11.

Figure 4:
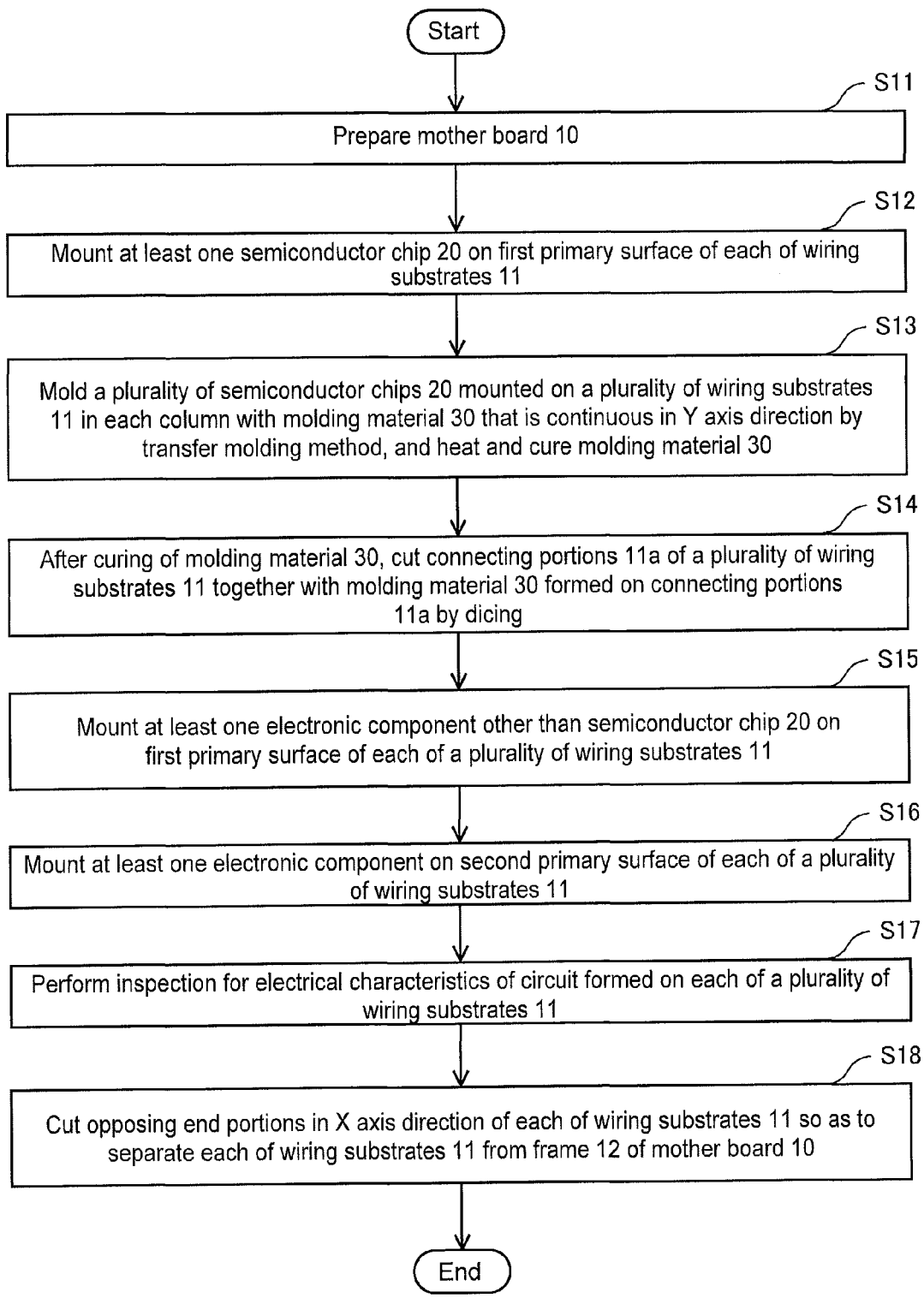
FIG. 4 is a diagram illustrating a method for manufacturing a circuit module according to a first embodiment of the invention.

Next, a method for manufacturing a circuit module according to a first embodiment of the invention will be described with reference to FIGS. 1 to 4. FIG. 4 is a flowchart illustrating a method for manufacturing a circuit module according to the first embodiment of the invention. In this manufacturing method, the molding material 30 is formed by a transfer molding method.

In step S11 shown in FIG. 4, for example, a mother board 10 as shown in FIG. 1 is prepared. The mother board 10 includes a plurality of wiring substrates 11 that each have a shape elongated in the X axis direction and are continuous via connecting portions 11a in the Y axis direction perpendicular to the X axis direction, and a frame 12 that supports at least the connecting portions 11a located at both outermost ends in the Y axis direction of the plurality of wiring substrates 11.

In step S12, at least one semiconductor chip 20 is mounted on a first primary surface of each of the wiring substrates 11. For example, an adhesive such as a silver (Ag) paste is applied to a predetermined region of the first primary surface of the wiring substrate 11. A bare chip is mounted on the predetermined region of the wiring substrate 11, with a plurality of outer connecting electrodes (pads) of the bare chip facing to the side opposite to the wiring substrate 11, and the adhesive is heated and cured. The bare chip is thereby fixed to the wiring substrate 11. Furthermore, wire bonding is performed by connecting the plurality of outer connecting electrodes of the bare chip to a plurality of electrodes provided on the first primary surface of the wiring substrate 11 respectively with the use of gold (Au) wires or the like.

In step S13, a molding material 30 is formed by a transfer molding method. To be specific, as shown in FIG. 1, the plurality of semiconductor chips 20 mounted on a plurality of wiring substrates 11 in each column are molded by a molding material 30 that is continuous in the Y axis direction, and the molding material 30 is heated and cured. The molding material 30 formed by the transfer molding method can withstand reflow processing performed later.

In step S14, after the molding material 30 has been cured, for example, as shown in FIG. 2, the connecting portions 11a of the plurality of wiring substrates 11 are cut together with the molding material 30 formed on the connecting portions 11a by dicing. As a result of the connecting portions 11a of the wiring substrates 11 being cut together with the molding material 30 formed on the connecting portions 11a by dicing in this way, it is possible to remove the molding material 30 along the end faces of the wiring substrates 11 without causing a crack in the molding material 30.

At this time, it is desirable that the connecting portions 11a of the plurality of wiring substrates 11 are cut together with the molding material 30 formed on the connecting portions 11a by dicing, without cutting the mother board 10 in a region other than the connecting portions 11a of the plurality of wiring substrates 11. In this case, the mother board 10 in the region other than the connecting portions 11a is not cut by dicing, and it is therefore possible to reduce contamination caused by a residue of the substrate material.

In step S15, at least one electronic component other than the semiconductor chip 20 is surface-mounted on the first primary surface of each of the plurality of wiring substrates 11. For example, a cream solder is printed on the first primary surface of the plurality of wiring substrates 11 by a cream solder printing machine, and electronic components are mounted on the first primary surface of the plurality of wiring substrates 11 by a chip mounter. After that, the plurality of wiring substrates 11 are allowed to pass through a reflow furnace so as to melt the solder, and the electronic components are fixed to the first primary surface of the plurality of wiring substrates 11 by the solder solidified by cooling.

In step S16, at least one electronic component is surface-mounted on a second primary surface that is opposite the first primary surface of the plurality of wiring substrates 11. The method for mounting an electronic component in step S16 is the same as that of step S15.

In step S17, a plurality of probes are respectively brought into contact with a plurality of measurement electrodes (pads) provided on the first or second primary surface of the wiring substrates 11, and inspection is performed for the electrical characteristics of the circuit formed on each of the wiring substrates 11 with the use of a measuring instrument.

In the above processing, the frame 12 of the mother board 10 may support, in addition to the connecting portions 11a located at both outermost ends in the Y axis direction of the plurality of wiring substrates 11, opposing end portions in the X axis direction of each of the wiring substrates 11. In this case, step S15 to S17 are performed in a state in which the plurality of wiring substrates 11 are supported by the frame 12 of the mother board 10.

Accordingly, after completion of processing such as the inspection of electrical characteristics performed on the plurality of wiring substrates 11 supported by the frame 12 of the mother board 10, in step S18, the opposing end portions in the X axis direction of each of the wiring substrates 11 are cut by, for example, punching with a die, and each of the wiring substrates 11 is thereby separated from the frame 12 of the mother board 10. Through this, individual circuit modules as shown in FIG. 3 are obtained.

Figure 5:
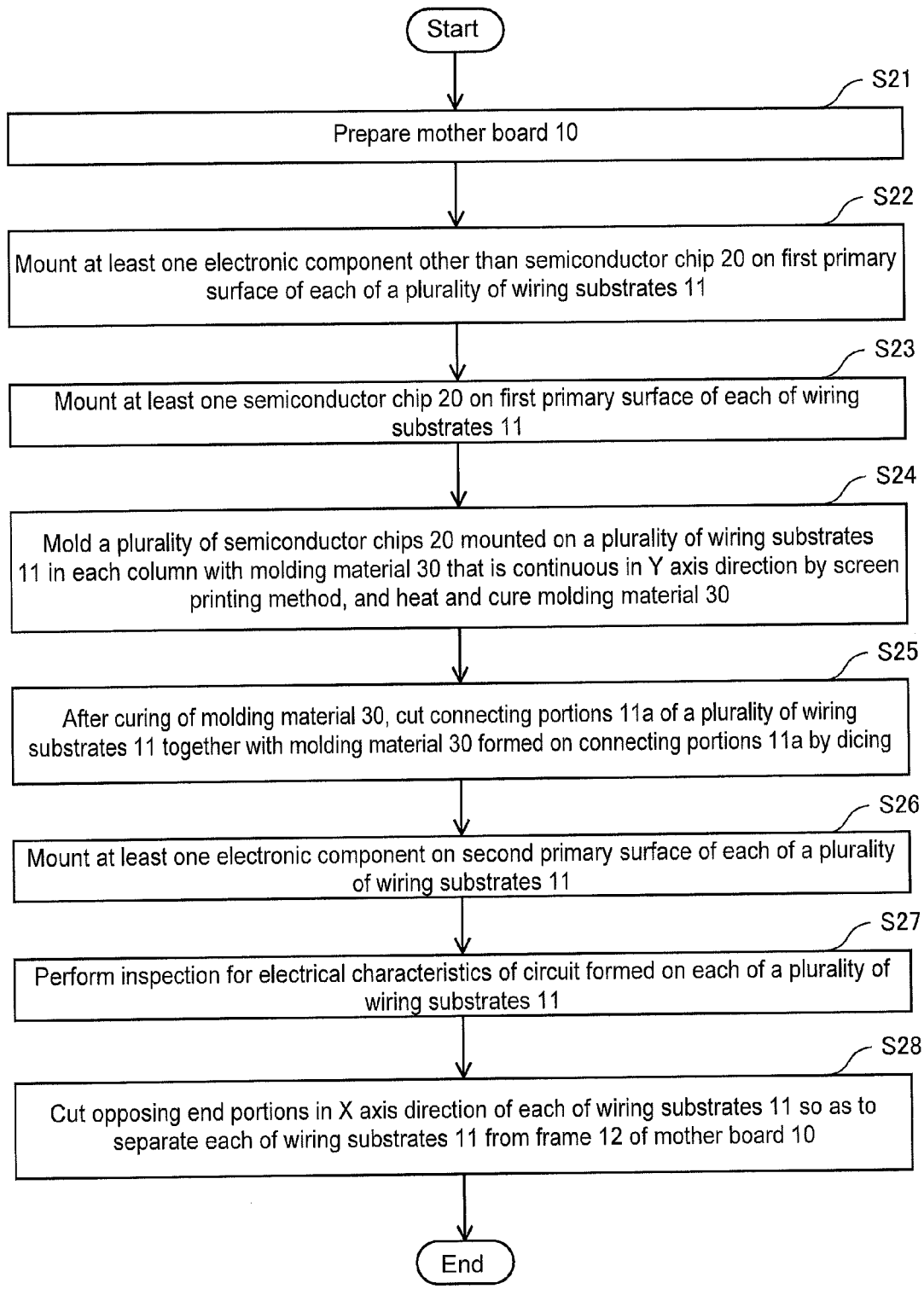
FIG. 5 is a diagram illustrating a method for manufacturing a circuit module according to a second embodiment of the invention.

Next, a method for manufacturing a circuit module according to a second embodiment of the invention will be described with reference to FIGS. 1 to 3 and 5. FIG. 5 is a flowchart illustrating a method for manufacturing a wiring substrate according to the second embodiment of the invention. In this manufacturing method, the molding material 30 is formed by a screen printing method.

In step S21 shown in FIG. 5, for example, a mother board 10 as shown in FIG. 1 is prepared. The mother board 10 includes a plurality of wiring substrates 11 that each have a shape elongated in the X axis direction and are continuous via connecting portions 11a in the Y axis direction perpendicular to the X axis direction, and a frame 12 that supports at least the connecting portions 11a located at both outermost ends in the Y axis direction of the plurality of wiring substrates 11.

In step S22, at least one electronic component other than a semiconductor chip 20 is surface-mounted on the first primary surface of each of the plurality of wiring substrates 11. The detailed processing in step S22 is the same as that of step S15 of the first embodiment. However, a molding material 30 formed by a screen printing method is susceptible to reflow processing. For this reason, the reflow processing performed on the first primary surface of the wiring substrates 11 is performed prior to molding processing.

In step S23, at least one semiconductor chip 20 is mounted on the first primary surface of each of the wiring substrates 11. The detailed processing in step S23 is the same as that of step S12 of the first embodiment.

In step S24, a molding material 30 is formed by a screen printing method. As the molding material 30, for example, a thermosetting resin in paste form is used. The screen printing method refers to a printing method in which a screen having a pattern defined by openings is placed on a printing object, and a paste is applied onto the screen so as to cause the paste to adhere only to the printing object in the openings of the screen. With the screen printing method, the plurality of semiconductor chips 20 mounted on a plurality of wiring substrates 11 in each column are molded by the molding material 30 that is continuous in the Y axis direction. Next, debubbling processing is performed so as to remove the air bubbles contained in the molding material 30. After that, the molding material 30 is heated and cured.

In step S25, after the molding material 30 has been cured, for example, as shown in FIG. 2, the connecting portions 11a of the plurality of wiring substrates 11 are cut together with the molding material 30 formed on the connecting portions 11a by dicing. The detailed processing in step S25 is the same as that of step S14 of the first embodiment.

In step S26, at least one electronic component is surface-mounted on a second primary surface that is opposite the first primary surface of the plurality of wiring substrates 11. The method for mounting an electronic component in step S26 is the same as step S16 of the first embodiment.

In step S27, a plurality of probes are respectively brought into contact with a plurality of measurement electrodes (pads) provided on the first or second primary surface of the wiring substrates 11, and inspection is performed for the electrical characteristics of the circuit formed on each of the wiring substrate 11 with the use of a measuring instrument.

In the above processing, the frame 12 of the mother board 10 may support, in addition to the connecting portions 11a located at both outermost ends in the Y axis direction of the plurality of wiring substrates 11, opposing end portions in the X axis direction of each of the wiring substrates 11. In this case, steps S26 and S27 are performed in a state in which the plurality of wiring substrates 11 is supported by the frame 12 of the mother board 10.

Accordingly, after completion of processing such as the inspection of electrical characteristics performed on the plurality of wiring substrates 11 supported by the frame 12 of the mother board 10, in step S28, the opposing end portions in the X axis direction of each of the wiring substrates 11 are cut by, for example, punching with a die, and each of the wiring substrates 11 is thereby separated from the frame 12 of the mother board 10. Through this, individual circuit modules as shown in FIG. 3 are obtained.

The above embodiments have been described taking the case in which a double-sided substrate is used as the wiring substrate, but the invention is not limited to the embodiments described above. For example, the invention is applicable to the case in which a single-sided substrate is used as the wiring substrate, and various other modifications can be made by those skilled in the art within the technical concept of the invention.

The entire disclosure of Japanese Patent Application No. 2013-219025, filed Oct. 22, 2013 is expressly incorporated by reference herein.

What is claimed is:

1. A circuit module comprising:
    a wiring substrate having a shape elongated in one direction;
    a semiconductor chip mounted on the wiring substrate;
    a molding material that molds the semiconductor chip; and
    end faces of the molding material that extend along a lengthwise direction of the wiring substrate and intersect with a lateral direction of the wiring substrate, the end faces being formed by dicing performed along end faces of a partial region of the wiring substrate,
    wherein the molding material is not cut in a direction substantially perpendicular to the lengthwise direction of the wiring substrate, and the wiring substrate has a width that is smaller than a length of the molding material in the lengthwise direction of the wiring substrate.

2. The circuit module according to claim 1,
    wherein the end faces of the molding material that extend along the lengthwise direction of the wiring substrate and intersect with the lateral direction of the wiring substrate are formed together with the end faces of the partial region of the wiring substrate by dicing after the molding material has been cured.

3. The circuit module according to claim 1,
    wherein the end faces of the partial region of the wiring substrate and end faces of another region of the wiring substrate are formed by different methods.

4. The circuit module according to claim 1,
    wherein the end faces of the partial region of the wiring substrate protrude in a widthwise direction of the wiring substrate with respect to the end faces of the other region in the lengthwise direction of the wiring substrate.

5. The circuit module according to claim 1,
    wherein the semiconductor chip comprises a semiconductor chip that is not encapsulated in a package, and is mounted on the wiring substrate by wire bonding.

6. A method for manufacturing a circuit module according to claim 1, the method comprising:
    (a) preparing a mother board including a plurality of wiring substrates that each have a shape elongated in a first direction and are continuous via a connecting portion in a second direction that is perpendicular to the first direction, and a frame that supports at least connecting portions located at both outermost ends in the second direction of the plurality of wiring substrates;
    (b) mounting a semiconductor chip on each of the plurality of wiring substrates;
    (c) molding the plurality of semiconductor chips mounted on the plurality of wiring substrates by a molding material that is continuous in the second direction, and heating and curing the molding material; and
    (d) after the molding material has been cured, cutting the connecting portion of the plurality of wiring substrates together with the molding material formed on the connecting portion by dicing.

7. The method of claim 5,
    wherein the step (d) includes cutting the connecting portion of the plurality of wiring substrates together with the molding material formed on the connecting portion by dicing, without cutting the mother board in a region other than the connecting portion of the plurality of wiring substrates.

8. The method of claim 6,
    wherein the frame of the mother board supports, in addition to the connecting portions located at both outermost ends in the second direction of the plurality of wiring substrates, opposing end portions in the first direction of each of the wiring substrates, and
    the method further includes (e) cutting the opposing end portions in the first direction of each of the wiring substrates so as to separate each of the wiring substrates from the frame of the mother board, which is performed after the step (d).

* * * * *